(12) United States Patent
Kurosawa et al.

(10) Patent No.: US 11,139,039 B2
(45) Date of Patent: Oct. 5, 2021

(54) MEMORY DEVICE HAVING MEMORY CELL AND CURRENT DETECTION CIRCUIT

(71) Applicant: Kioxia Corporation, Tokyo (JP)

(72) Inventors: Tomonori Kurosawa, Zama Kanagawa (JP); Dai Nakamura, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 16/816,900

(22) Filed: Mar. 12, 2020

(65) Prior Publication Data

US 2021/0057032 A1 Feb. 25, 2021

(30) Foreign Application Priority Data

Aug. 20, 2019 (JP) .............................. JP2019-150363

(51) Int. Cl.
*G11C 16/34* (2006.01)
*G11C 16/24* (2006.01)
*G11C 16/08* (2006.01)
*G11C 16/04* (2006.01)

(52) U.S. Cl.
CPC ...... *G11C 16/3481* (2013.01); *G11C 16/0483* (2013.01); *G11C 16/08* (2013.01); *G11C 16/24* (2013.01)

(58) Field of Classification Search
CPC . G11C 16/3481; G11C 16/0483; G11C 16/08; G11C 16/24
See application file for complete search history.

(56) References Cited

U.S. PATENT DOCUMENTS

| 10,395,730 B2 * | 8/2019 | Mori ....................... G11C 5/147 |
| 2017/0316834 A1 * | 11/2017 | Huynh ............... G11C 16/3459 |
| 2018/0075912 A1 | 3/2018 | Shimizu |

FOREIGN PATENT DOCUMENTS

JP 2018-45747 A 3/2018

* cited by examiner

*Primary Examiner* — David Lam
(74) *Attorney, Agent, or Firm* — Foley & Lardner LLP

(57) ABSTRACT

According to one embodiment, a memory device includes a memory cell, a word line connected to the memory cell, a word line driver which generates a selection signal for the word line, a first transistor including a gate to which the selection signal generated by the word line driver is input, and a drain which supplies a signal based on the selection signal to the word line, and a detection circuit which detects a value based on a current flowing through the first transistor during a verification period after writing data to the memory cell.

12 Claims, 6 Drawing Sheets

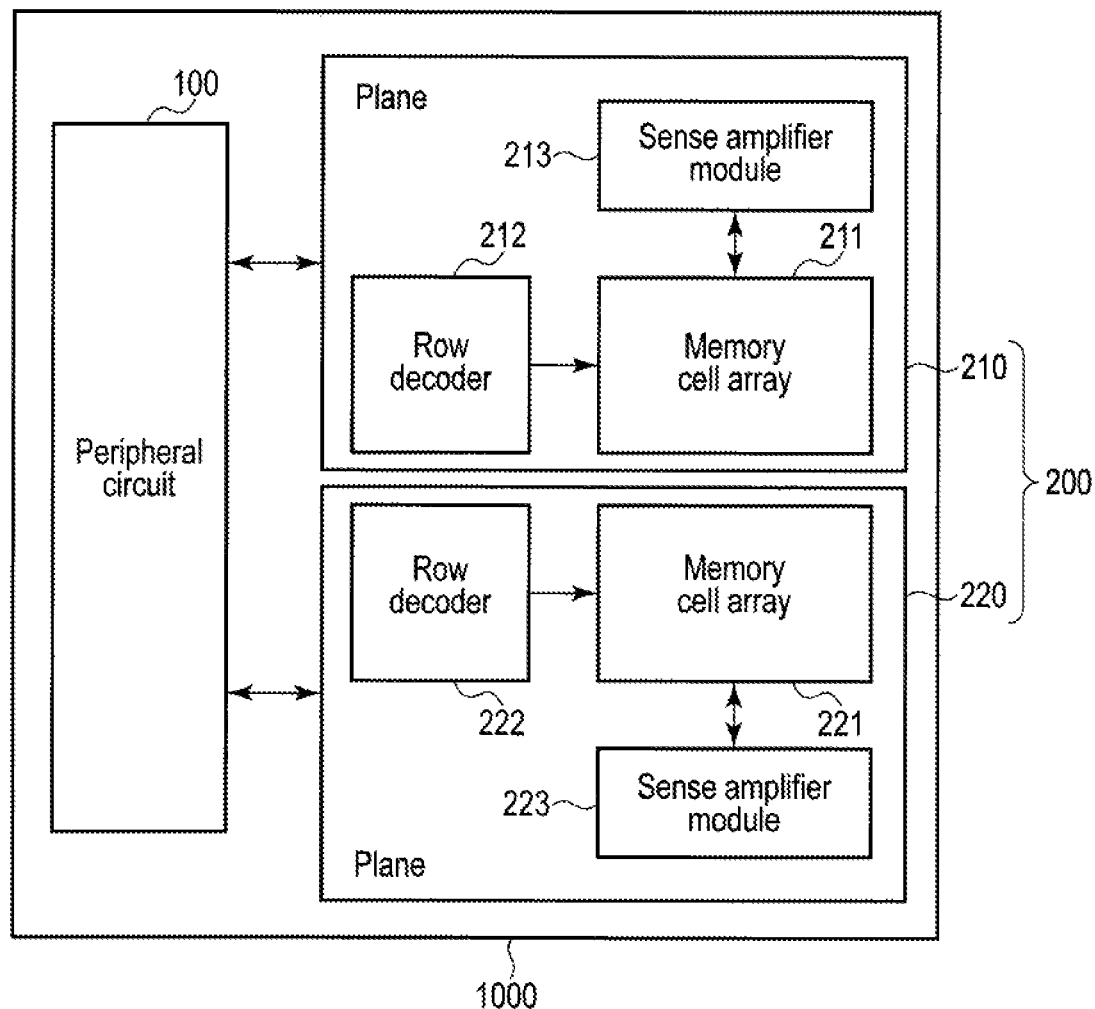
F I G. 1

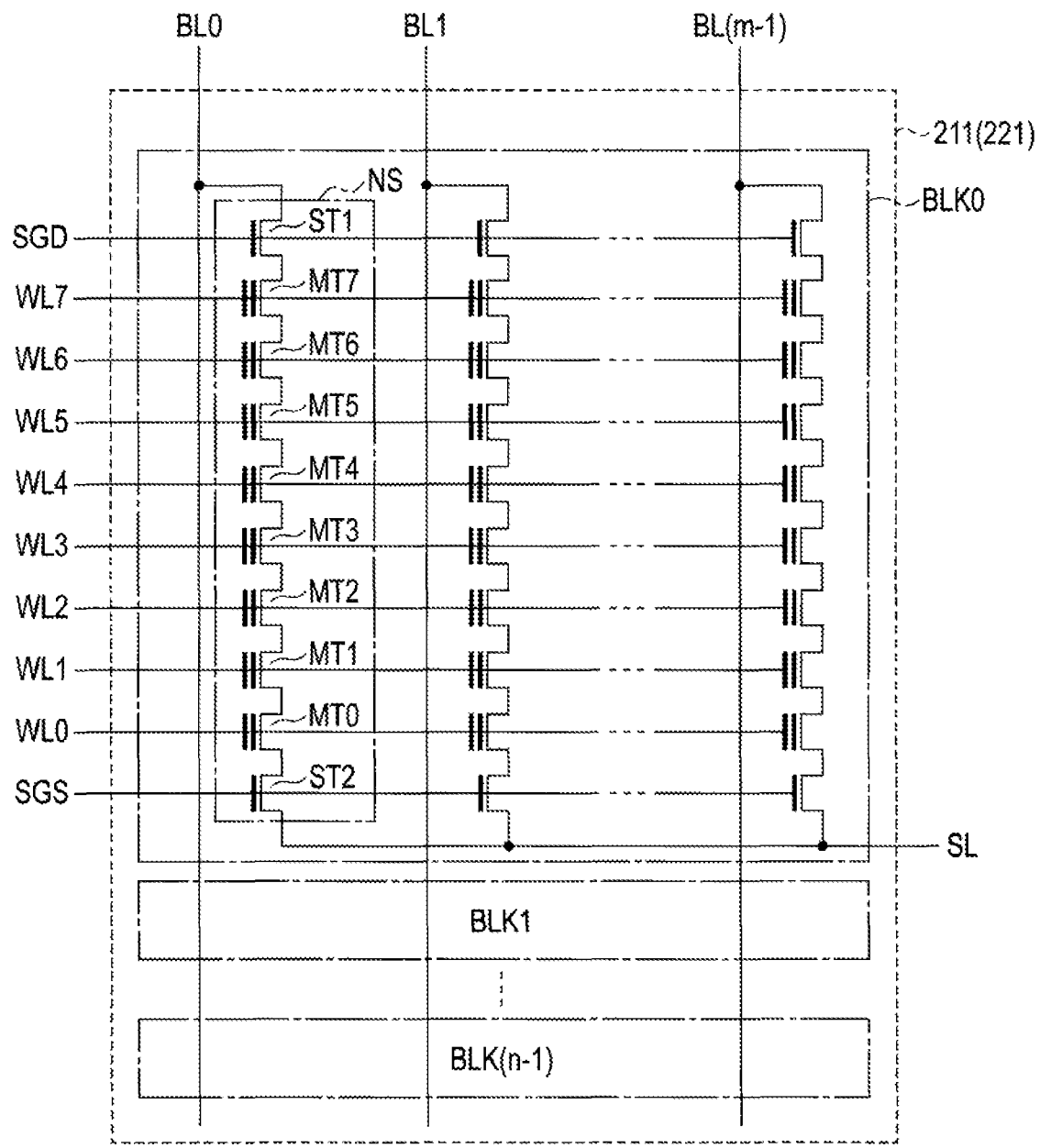
F I G. 2

MEMORY DEVICE HAVING MEMORY CELL AND CURRENT DETECTION CIRCUIT

CROSS-REFERENCE TO RELATED APPLICATIONS

This application is based upon and claims the benefit of priority from Japanese Patent Application No. 2019-150363, filed Aug. 20, 2019, the entire contents of which are incorporated herein by reference.

FIELD

Embodiments described herein relate generally to a memory device.

BACKGROUND

In a memory device (semiconductor integrated circuit device) in which memory cells are integrated on a semiconductor substrate, when leakage of current occurs between word lines adjacent to each other, proper operation thereof may not be performed.

Therefore, it is important to accurately detect leakage between word lines. Moreover, it is also important to detect leak between word lines without barring high-speed operation.

BRIEF DESCRIPTION OF THE DRAWINGS

FIG. 1 is a block diagram schematically showing an entire structure of a memory device according to an embodiment.

FIG. 2 is an electric circuit diagram showing a concrete structure of a memory cell array of the memory device according to the embodiment.

DETAILED DESCRIPTION

Figure 3:
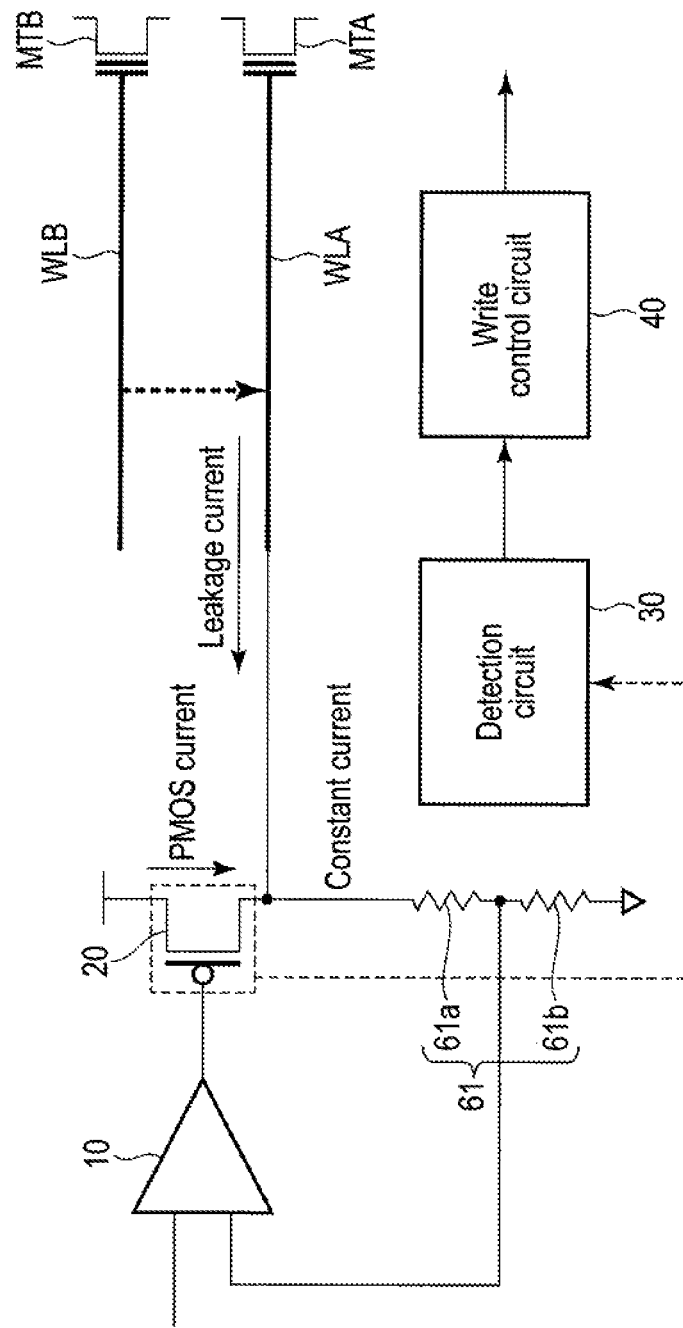
FIG. 3 is a diagram showing a basic structure of a detection circuit of the memory device according to the embodiment for illustrating the principle thereof.

In general, according to one embodiment, a memory device includes: a memory cell; a word line connected to the memory cell; a word line driver which generates a selection signal for the word line; a first transistor including a gate to which the selection signal generated by the word line driver is input, and a drain which supplies a signal based on the selection signal to the word line; and a detection circuit which detects a value based on a current flowing through the first transistor during a verification period after writing data to the memory cell.

Hereafter, an embodiment will be described with reference to accompanying drawings.

FIG. 1 is a block diagram schematically showing an entire structure of a memory device (semiconductor integrated circuit device) according to the embodiment.

As shown in FIG. 1, a memory device 1000 according to this embodiment includes a peripheral circuit 100 and a memory circuit 200.

The peripheral circuit 100 transmits and receives various signals between itself and a memory controller (not shown) and controls various operations (write operation, read operation, erase operation and the like) of the memory circuit 200.

The memory circuit 200 includes a plurality of planes 210 and 220. A plane is a unit which may independently execute write operation, read operation and erase operation. That is, a plane is the minimum unit by which write operation, read operation or erase operation is executed. In an example shown in FIG. 1, the memory circuit 200 includes two planes 210 and 220, but the number of planes is not particularly limited.

The basic structures of the plane 210 and plane 220 are the same as each other. The plane 210 includes a memory cell array 211, a row decoder 212 and a sense amplifier module 213, and the plane 220 includes a memory cell array 221, a row decoder 222 and a sense amplifier module 223.

FIG. 2 is an electric circuit diagram showing a concrete structure of a memory cell array (the memory cell array 211 or the memory cell array 221).

As shown in FIG. 2, the memory cell array (the memory cell array 211 or the memory cell array 221) includes a plurality of blocks BLK0 to BLK(n−1). Each block BLK includes a plurality of nonvolatile memory cells (nonvolatile memory cell transistors) MT, and it is a unit of erase data.

Each block BLK includes a plurality of NAND strings NS. The NAND strings NS are provided for bit lines BL0 to BL(m−1), respectively. Each NAND string NS includes a select transistor ST1, a select transistor ST2, and a plurality of memory cell transistors MT0 to MT7. The memory cell transistors MT0 to MT7 are connected in series between the select transistor ST1 and the select transistor ST2. In the example shown in FIG. 2, each NAND string NS includes eight memory cell transistors MT0 to MT7, but the number of memory cell transistors is not particularly limited.

Each memory cell transistor MT includes a control gate and a charge storage layer, and may store data according to the amount of electric charge stored in the charge storage layer in a nonvolatile way. The memory cell transistor MT may adopt a single-level cell (SLC) system which stores 1-bit data or a multi-level cell (MLC) system which stores data of a plurality of bits.

In the same block, the gates of the select transistors ST1 are commonly connected to each other by a select gate line SGD, and the gates of the select transistors ST2 are commonly connected to each other by a select gate line SGS. Moreover, the control gates of the memory cell transistors MT0 to MT7 are commonly connected to each other by word lines WL0 to WL7, respectively.

In the same memory cell array, the drains of the select transistors ST1 located in the same column are commonly connected to each other by the corresponding bit line BL. In the same block BLK, the sources of the select transistors ST2 are commonly connected to each other by a source line SL.

Next, mainly, a detection circuit in the memory device according to this embodiment will be described. The detection circuit is provided in the peripheral circuit 100 shown in FIG. 1.

FIG. 3 is a diagram showing a basic structure of a detection circuit of the memory device according to the embodiment for illustrating the principle thereof.

FIG. 3 is directed to a case on the assumption that data is written to a nonvolatile memory cell transistor (nonvolatile memory cell) MTA connected to a selected word line WLA. A word line adjacent to the selected word line WLA is denoted by WLB and a nonvolatile memory cell transistor connected to the word line WLB is denoted by MTB.

A selection signal for the word line WLA is generated by the word line driver 10. The selection signal generated by the word line driver 10 is input to the gate of the PMOS transistor 20 (the first transistor). The drain of the PMOS transistor 20 is connected to the word line WLA, the signal based on the selection signal is supplied to the word line WLA from the drain of the PMOS transistor 20, and the data is written to the memory cell transistor MTA selected by the word line WLA.

Moreover, to the drain of the PMOS transistor 20, a voltage dividing circuit 61 including a resistor 61*a* and a resistor 61*b* is connected.

Here, when the word line WLA and the word line WLB are short-circuited with each other to allow leakage current flow between the word line WLA and the word line WLB, the normal operations may no longer be carried out. Especially, when the common power supply circuit is used for a plurality of planes (the planes 210 and 220 in the example of FIG. 1), the influence of a defective block BLK in which leakage between word lines is occurring, may undesirably affect all the other planes. Therefore, it is desirable to provide a detection circuit which detects leakage between word lines.

In a detection circuit conventionally proposed, a leakage-current detecting period is set between a programming period (a period in which data are written to memory cells) and a verification period (a period in which the data written to the memory cell are verified), and thus such a procedure is adopted that the verification period is taken and then shifted to the programming period via the detection period interposed therebetween. Thus, conventionally, the detection period is provided after the verification period, and therefore such a problem exists that the high-speed operation is barred by the detection period thus provided.

In this embodiment, a detection circuit 30 is provided, which detects a value based on the current flowing through the PMOS transistor 20 during the verification period. A write control circuit 40 is connected to the detection circuit 30, and the write control circuit 40 carries out write control after a verification period based on the detection result obtained in the detection circuit 30. That is, when the detection result obtained in the detection circuit 30 does not satisfy a predetermined criterion, it is determined that leaking in the word line WLA is occurring, and thus writing to all the memory cell transistors connected at least to the word line WLA is inhibited. For example, the block BLK containing the word line WLA judged to have leakage is treated as a bad block.

Figure 4:
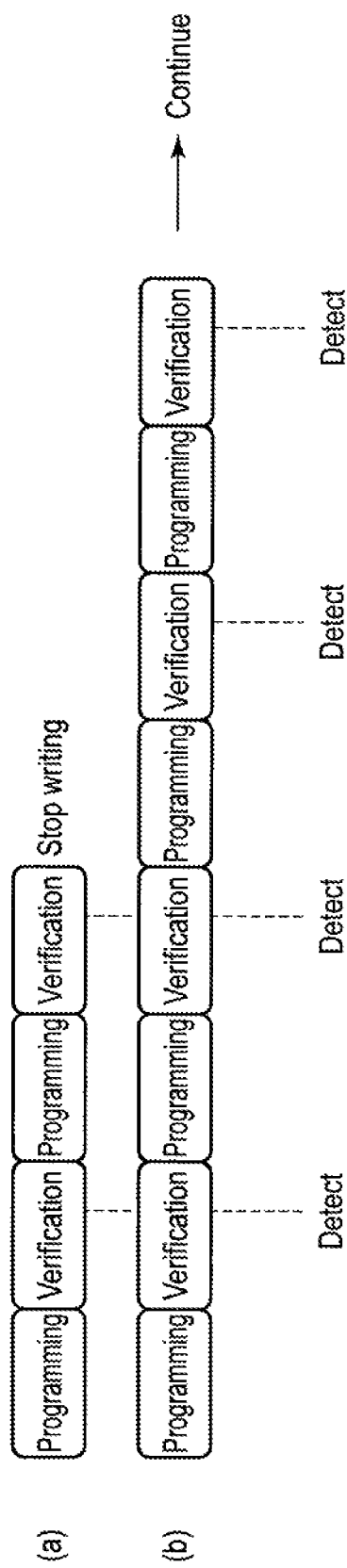
FIG. 4 is a diagram briefly illustrating the procedure of a detection method in a memory device according to the embodiment.

FIG. 4 is a diagram briefly illustrating the procedure of a detection method in the above-described embodiment.

As shown in FIG. 4, in this embodiment, the detection operation is carried out at a predetermined time in the verification period set after the program period in which data are written to memory cells. That is, at the predetermined time in the verification period, the value based on the current flowing through the PMOS transistor 20 is detected in the detection circuit 30. The write control circuit 40 carries out write control based on the detection result obtained in the detection circuit 30. When the detection result obtained in the detection circuit 30 does not satisfy the predetermined criterion, write operation after that is inhibited as shown in FIG. 4, part (a). When the detection result obtained in the detection circuit 30 satisfies the predetermined criterion, the write operation after that is continued as shown in FIG. 4, part (b). The determination as to whether the inhibition of write operation or continuation of write operation is also executed during the verification period.

Figure 5:
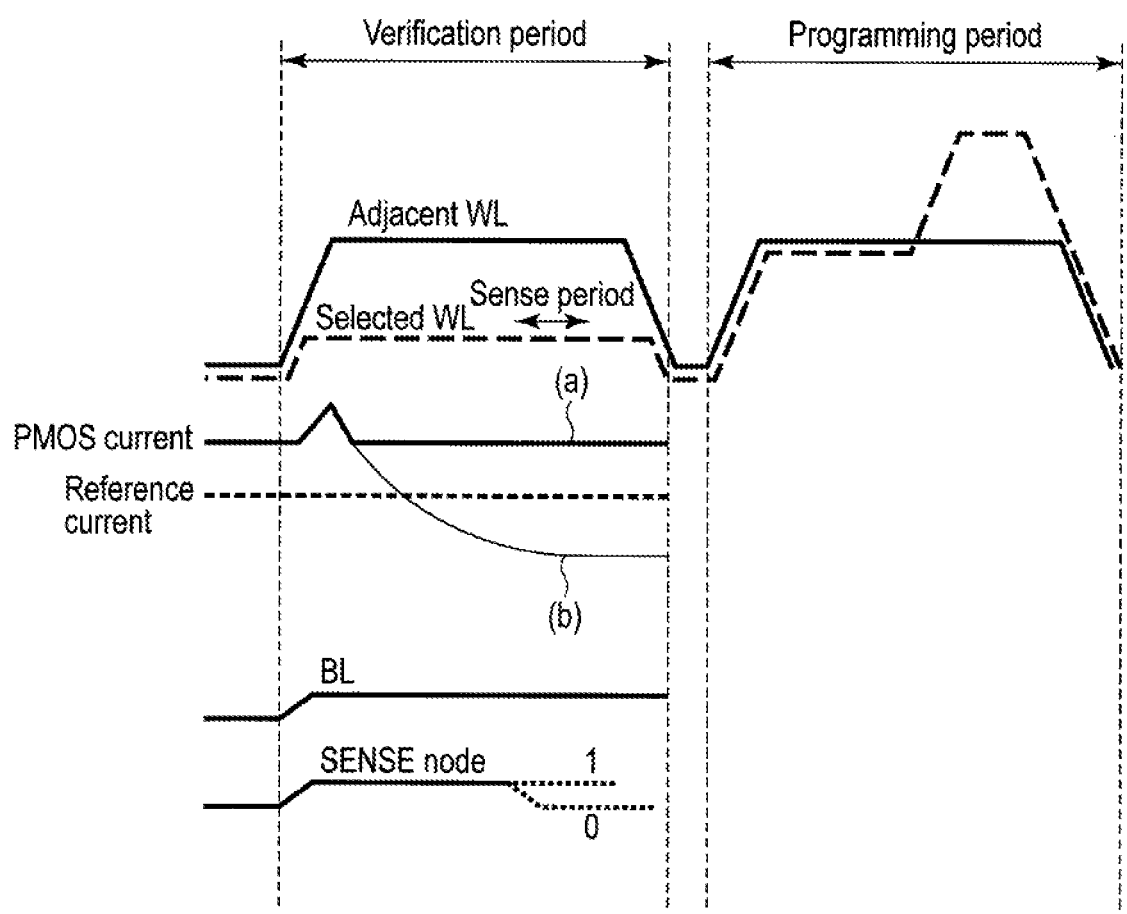
FIG. 5 is a diagram showing waveforms of each part in a verification period and a programming period of the memory device according to the embodiment.

FIG. 5 is a diagram showing waveforms (voltage waveforms and current waveforms) of each part in the verification period and the programming period (write period).

As will be described later, a constant current is supplied to a voltage dividing circuit 61 shown in FIG. 3. Therefore, the constant current supplied to the voltage dividing circuit 61 has a value obtained by adding the current (PMOS current) flowing through the PMOS transistor 20 and the leakage current flowing through the selected word line WLA. That is, the current flowing through the PMOS transistor 20 is dependent on the leakage current flowing through the selected word line WLA. Therefore, when the selected word line WLA and the adjacent word line WLB are not short-circuited to each other, the leakage current is zero and the current (a) flowing through the PMOS transistor 20 is maintained at a constant value. On the other hand, when the selected word line WLA and the adjacent word line WLB are short-circuited to each other, the leakage current flows in the selected word line WLA, and therefore the current (b) flowing through the PMOS transistor 20 is decreased. Therefore, detection operation is carried out at the predetermined time in the verification period and the current (PMOS current) flowing through the PMOS transistor 20 is compared with a reference current, and thus whether or not the occurrence of leakage current (the occurrence of short-circuiting) may be determined.

Note that the timing of performing the detection operation (the predetermined time) is not particularly limited as long as it is a timing when the PMOS current is lower than the reference current by due to leakage (short-circuiting) between word lines. For example, it may be before the sense period in which the potential of a bit line (BL) is sensed, or during the sense period or after the sense period.

As described above, in this embodiment, the value based on the current flowing through the PMOS transistor 20 is detected by the detection circuit 30, and thus leakage current during the verification period may be detected. Therefore, a detection period separate from the verification period and the program period need not be provided, and thus write operation may be carried out immediately after the verification period. Thus, in this embodiment, it becomes possible to accurately detect leakage between word lines without barring the high-speed operation.

Next, an example of a detailed structure of the detection circuit 30 of the memory device to according to this embodiment will be described with reference to FIG. 6.

This example is also directed to a case on the assumption that data is written to a memory cell transistor MTA connected to a selected word line WLA as in the case of FIG. 3. The case is, for example, that a voltage of 1V is applied to the selected word line WLA, a voltage of 8V is applied to the adjacent word line WLB, and leakage current flowing between the word line WLA and the word line WLB is detected.

Figure 6:
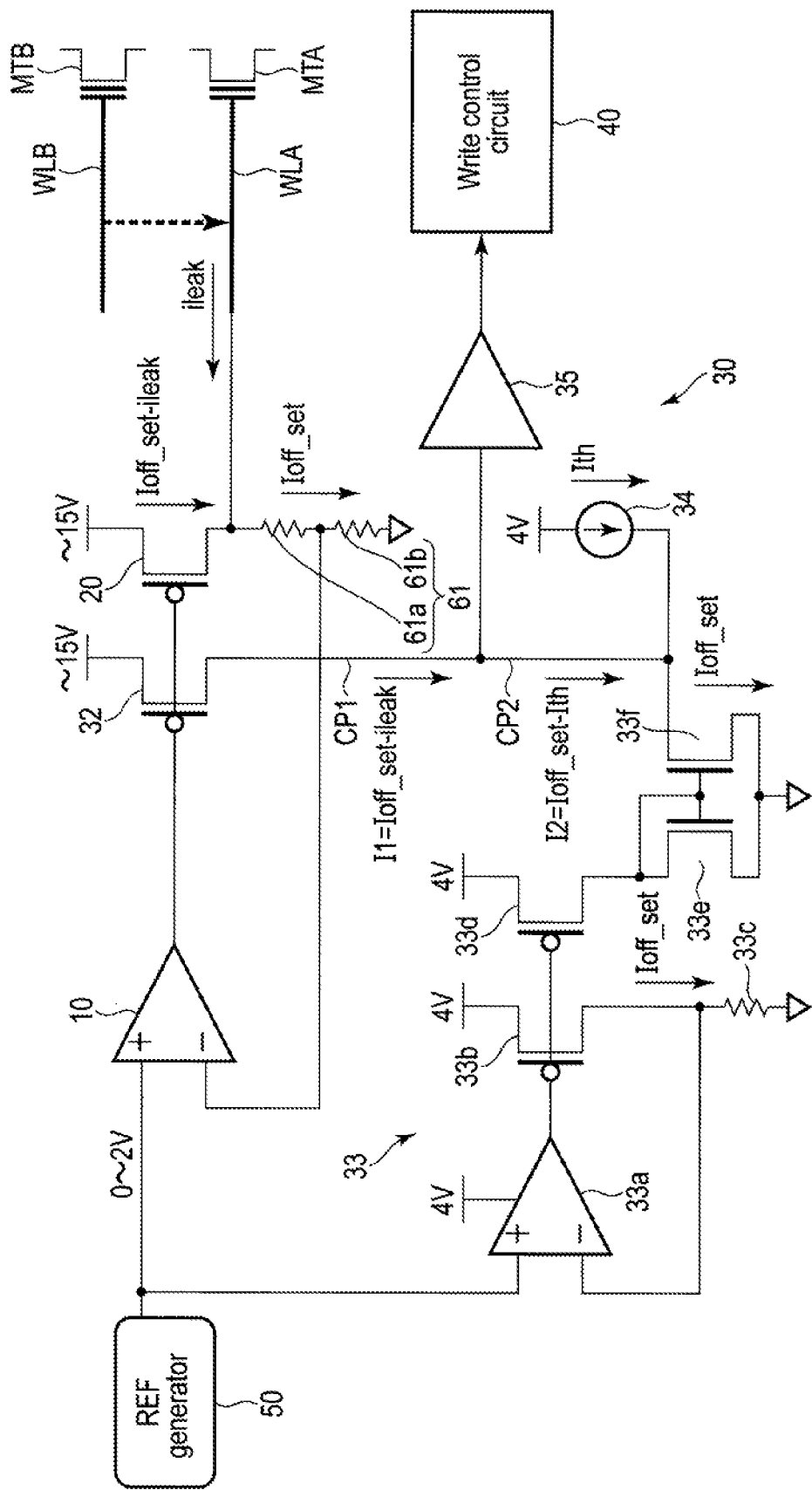
FIG. 6 is a diagram showing a detailed configuration example of structure of the detection circuit of the memory device according to the embodiment.

As shown in FIG. 6, the detection circuit 30 includes a PMOS transistor (second transistor) 32, an equivalent current generating circuit 33, a constant current source 34 and a comparator 35.

The voltage dividing circuit 61 is connected to the drain of the PMOS transistor (the first transistor) 20, and a current of a total of the current flowing through the PMOS transistor 20 and the current flowing through the word line WLA flows to the voltage dividing circuit 61. In FIG. 6, the current flowing through the voltage dividing circuit 61 is referred to as Ioff_set. Moreover, the current flowing through the word line WLA is referred to as ileak. Therefore, the current flowing through the PMOS transistor 20 is Ioff_set–ileak.

The voltage dividing circuit 61 comprises a resistor 61a (resistance value of 3R) and the resistor 61b (resistance value of 1R) connected in series to the PMOS transistor 20. The signal obtained at a connection portion between the resistor 61a and the resistor 61b, which is a voltage signal divided by the resistor 61a and the resistor 61b is fed back to an inverting input of the operational amplifier which constitutes the word line driver 10. To a non-inverting input of the operational amplifier (the word line driver 10), a predetermined voltage (a constant voltage of about 0V to 2V) is input from the REF generator 50. Further, an output of the operational amplifier (word line driver 10) is input to the gate of the PMOS transistor 20. That is, to the gate of the PMOS transistor 20, the selection signal generated by the word line driver 10 is input. With this structure, a constant current Ioff_set flows to the voltage dividing circuit 61.

The output of the operational amplifier (word line driver 10) is input also to the gate of the PMOS transistor (the second transistor) 32. That is, the selection signal generated by the word line driver 10 is input also to the gate of the PMOS transistor 32. The PMOS transistor 32 has characteristics equivalent to those of the PMOS transistor 20, and to the source of the PMOS transistor 32, a power supply voltage (about 15V) the same as that of the source of the PMOS transistor 20 is applied. Thus, a current equal to that flowing through the PMOS transistor 20 flows through the PMOS transistor 32. Therefore, the current flowing through the PMOS transistor 32 is Ioff_set–ileak, and a current I1=Ioff_set–ileak flows to a current path CP1.

The equivalent current generating circuit 33 generates a current Ioff_set equal to the current flowing through the voltage dividing circuit 61, and comprises an operational amplifier 33a, a PMOS transistor 33b, a resistor 33c, a PMOS transistor 33d, an NMOS transistor 33e and an NMOS transistor 33f.

To a noninverting input of the operational amplifier 33a, an output voltage from the REF generator 50 is input. To an inverting input of the operational amplifier 33a, a voltage at the connection portion between the PMOS transistor 33b and the resistor 33c is fed back. The PMOS transistor 33b has characteristics equivalent to those of the PMOS transistor 20. Moreover, the resistor 33c has a resistance value of R1, which is the same as the resistance R1 of the resistor 61b included in the voltage dividing circuit 61. Therefore, the current flowing to the resistor 33c is the same as that flowing to the voltage dividing circuit 61, and the current Ioff_set flows through the PMOS transistor 33b and the resistor 33c connected in series.

The PMOS transistor 33d has characteristics equivalent to those of the PMOS transistor 33b, and to a source of the PMOS transistor 33d, a power supply voltage (4V) the same as that to the source of the PMOS transistor 33b is applied. Thus, a current equal to that flowing through the PMOS transistor 33b flows through the PMOS transistor 33d. That is, the current Ioff_set flows through the PMOS transistor 33d, and the current Ioff_set flows also through the NMOS transistor 33e connected in series to the PMOS transistor 33d.

Moreover, the NMOS transistor 33f has characteristics equivalent to those of the NMOS transistor 33e, and the gate of the NMOS transistor 33f and the gate of the NMOS transistor 33e are connected in common. Therefore, a current Ioff_set the same as that flowing through the NMOS transistor 33e flows also through the NMOS transistor 33f.

The constant current source 34 is connected to the drain of the NMOS transistor 33f included in the equivalent current generating circuit 33 and the constant current Ith is supplied from the constant current source 34.

As described above, in the equivalent current generating circuit 33, the current Ioff_set is generated and the current Ioff_set flows through the NMOS transistor 33f. Therefore, to the current path CP2, the current I2=Ioff_set–Ith flows.

To the comparator 35, a differential current (I1–I2=Ith–ileak) of the first current (I1=Ioff_set–ileak) flowing to the current path CP1 and the second current (I2=Ioff_set–Ith) flowing to the current path CP2 is supplied. In the comparator 35, it is determined based on the differential current (Ith–ileak) as to whether or not the amount of ileak is greater than a predetermined reference value. For example, it is determined whether the amount of ileak is greater than the amount of Ith.

In the write control circuit 40, write control after the verification period is carried out based on the detection result obtained by the detection circuit 30. For example, if the amount of ileak is greater than the predetermined reference value, it is judged that leakage is occurring in a word line WLA, and the block BLK containing the word line WLA is treated as a bad block. Write operation after that is inhibited.

As described above, in the example with the structure shown in FIG. 6, the value based on the current which flows through the PMOS transistor 20 may be detected by detecting the value based on the current I1 flowing to the current path CP1 (that is, the current I1 flowing through the PMOS transistor 32). Thus, leakage in the word line WLA may be accurately detected during the verification period.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a memory cell;
a word line connected to the memory cell;
a word line driver which generates a selection signal for the word line;
a first transistor including a gate to which the selection signal generated by the word line driver is input, and a drain which supplies a first signal based on the selection signal to the word line;
a detection circuit which detects a value based on a current flowing through the first transistor during a verification period after writing data to the memory cell; and
a voltage dividing circuit connected to the drain of the first transistor,
wherein the detection circuit includes a second transistor including a gate to which the selection signal generated by the word line driver is input, and through which a current equal to a current flowing through the first transistor flows.

2. The memory device of claim 1, wherein
a constant current flows through the voltage dividing circuit.

3. The memory device of claim 1, wherein
the voltage dividing circuit includes a resistor.

4. The memory device of claim 1, wherein
a signal obtained at a predetermined portion of the voltage dividing circuit is fed back to the word line driver.

5. The memory device of claim 1, wherein
the detection circuit detects the value based on the current flowing through the first transistor during the verification period by detecting a value based on the current flowing through the second transistor during the verification period.

6. The memory device of claim 1, wherein
the detection circuit includes an equivalent current generating circuit which generates a current equal to a current flowing through the voltage dividing circuit.

7. The memory device of claim 6, wherein
the detection circuit includes a constant current source connected to the equivalent current generating circuit, and
when a first current is defined as the current flowing through the second transistor, and a second current is defined as a difference between the current generated by the equivalent current generating circuit and a current generated by the constant current source, the detection circuit detects a value based on a difference between the first current and the second current.

8. The memory device of claim 1, wherein
the first transistor is a PMOS transistor.

9. The memory device of claim 1, wherein
the memory cell is a nonvolatile memory cell.

10. The memory device of claim 1, wherein
the current flowing through the first transistor during the verification period is dependent on a leakage current flowing through the word line.

11. The memory device of claim 1, further comprising:
a write control circuit which carries out write control after the verification period based on a detection result obtained by the detection circuit.

12. The memory device of claim 11, wherein
the write control circuit inhibits write operation after the verification period if the detection result obtained by the detection circuit fails to satisfy a predetermined criterion.

* * * * *